US011223000B2

(12) United States Patent
Marutani

(10) Patent No.: US 11,223,000 B2
(45) Date of Patent: Jan. 11, 2022

(54) METHOD OF MANUFACTURING LIGHT EMITTING ELEMENT MOUNTING BASE MEMBER, METHOD OF MANUFACTURING LIGHT EMITTING DEVICE USING THE LIGHT EMITTING ELEMENT MOUNTING BASE MEMBER, LIGHT EMITTING ELEMENT MOUNTING BASE MEMBER, AND LIGHT EMITTING DEVICE USING THE LIGHT EMITTING ELEMENT MOUNTING BASE MEMBER

(71) Applicant: NICHIA CORPORATION, Anan (JP)

(72) Inventor: Yukitoshi Marutani, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/831,812

(22) Filed: Mar. 27, 2020

(65) Prior Publication Data
US 2020/0227607 A1 Jul. 16, 2020

Related U.S. Application Data

(62) Division of application No. 15/475,164, filed on Mar. 31, 2017, now Pat. No. 10,644,210.

(30) Foreign Application Priority Data

Apr. 1, 2016 (JP) ................................ 2016-074776
Mar. 27, 2017 (JP) ................................ 2017-061242

(51) Int. Cl.
*H01L 33/00* (2010.01)
*H01L 33/62* (2010.01)
(Continued)

(52) U.S. Cl.
CPC .......... *H01L 33/62* (2013.01); *H01L 25/0753* (2013.01); *H01L 25/13* (2013.01);
(Continued)

(58) Field of Classification Search
CPC . H01L 23/4922; H01L 25/0753; H01L 25/13; H01L 25/50; H01L 33/58; H01L 33/62; H01S 5/023
See application file for complete search history.

(56) References Cited

U.S. PATENT DOCUMENTS 4,095,011 A 6/1978 Hawrylo et al.
4,608,097 A 8/1986 Weinberger et al.
(Continued)

FOREIGN PATENT DOCUMENTS

JP 6-302864 10/1994
JP 10-193020 7/1998
(Continued)

OTHER PUBLICATIONS

Shao et al., "Exploring the critical thickness for maximum reflectance of optical reflectors based on polymer-filler composites", Optical Materials Express 6 (2016) pp. 1106-1113, See Cite No. 68.
(Continued)

*Primary Examiner* — Jay C Kim
(74) *Attorney, Agent, or Firm* — Mori & Ward, LLP

(57) ABSTRACT

A method of manufacturing a light emitting element mounting base member includes: providing a first insulating member in a plate shaped having at least one recess portion or at least one through-hole; disposing in the recess portion or in the through-hole a light blocking resin and a plurality of core members each equipped with a second insulating member having light reflectivity on each surface of a plurality of electrical conductor cores; and exposing at least one of the surface of the electrical conductor cores from the second insulating members by removing each part of at least one of the second insulating members.

6 Claims, 7 Drawing Sheets

(51) Int. Cl.
  *H01L 25/075* (2006.01)
  *H01L 25/13* (2006.01)
  *H01L 25/00* (2006.01)
  *H01L 33/58* (2010.01)
  *H01L 23/492* (2006.01)
  *H01L 23/498* (2006.01)
  *H01S 5/023* (2021.01)
  *H01S 5/0233* (2021.01)
  *H01S 5/0235* (2021.01)
  *H01L 33/60* (2010.01)

(52) U.S. Cl.
  CPC .............. *H01L 25/50* (2013.01); *H01L 33/58* (2013.01); *H01L 23/4922* (2013.01); *H01L 23/49827* (2013.01); *H01L 33/60* (2013.01); *H01L 2933/0058* (2013.01); *H01L 2933/0066* (2013.01); *H01S 5/023* (2021.01); *H01S 5/0233* (2021.01); *H01S 5/0235* (2021.01)

(56) References Cited

U.S. PATENT DOCUMENTS

| | | | |
|---|---|---|---|
| 4,791,248 | A | 12/1988 | Oldenettel |
| 5,220,135 | A | 6/1993 | Kawakami et al. |
| 5,231,751 | A | 8/1993 | Sachdev et al. |
| 5,374,788 | A | 12/1994 | Endoh et al. |
| 6,008,525 | A | 12/1999 | Barron et al. |
| 6,009,620 | A | 1/2000 | Bhatt et al. |
| 6,045,240 | A | 4/2000 | Hochstein |
| 6,204,453 | B1 | 3/2001 | Fallon et al. |
| 6,221,769 | B1 | 4/2001 | Dhong et al. |
| 6,340,824 | B1 | 1/2002 | Komoto et al. |
| 6,365,844 | B2 | 4/2002 | Nishii et al. |
| 6,518,515 | B2 | 2/2003 | Nishii et al. |
| 6,645,607 | B2 | 11/2003 | Curcio et al. |
| 7,244,628 | B2 | 7/2007 | Tamura et al. |
| 7,609,737 | B2 | 10/2009 | Matsumura et al. |
| 7,800,002 | B2 | 9/2010 | Chujo et al. |
| 7,918,020 | B2 | 4/2011 | Chujo et al. |
| 7,972,031 | B2 | 7/2011 | Ray et al. |
| 8,133,768 | B2 | 3/2012 | Ray et al. |
| 8,158,983 | B2 | 4/2012 | Beeson et al. |
| 8,198,551 | B2 | 6/2012 | Japp et al. |
| 8,749,009 | B2 | 6/2014 | Young et al. |
| 8,889,216 | B2 | 11/2014 | Ray et al. |
| 9,030,551 | B2 | 5/2015 | Schmidt et al. |
| 9,332,632 | B2 | 5/2016 | Schneider et al. |
| 9,368,549 | B1 | 6/2016 | Oraw et al. |
| 9,428,680 | B2 | 8/2016 | Zambova |
| 9,447,308 | B2 | 9/2016 | Albaugh et al. |
| 9,574,050 | B2 | 2/2017 | Tasaki et al. |
| 9,679,863 | B2 * | 6/2017 | Lin ..................... H01L 25/105 |
| 9,905,740 | B2 | 2/2018 | Shirahama |
| 9,953,792 | B2 | 4/2018 | Yoneda |
| 10,049,964 | B2 * | 8/2018 | Shim ..................... H01L 24/97 |
| 2002/0132450 | A1 | 9/2002 | Nose |
| 2003/0189215 | A1 | 10/2003 | Lee et al. |
| 2011/0133232 | A1 | 6/2011 | Yoshioka et al. |
| 2015/0228872 | A1 | 8/2015 | Nagano |
| 2016/0014878 | A1 | 1/2016 | Kilhenny |
| 2016/0107145 | A1 | 4/2016 | Okazaki et al. |
| 2016/0190395 | A1 | 6/2016 | Shirahama |
| 2017/0033073 | A1 | 2/2017 | Ghoshal et al. |
| 2017/0229619 | A1 | 8/2017 | Mclaughlin et al. |

FOREIGN PATENT DOCUMENTS

| | | |
|---|---|---|
| JP | 2002-270711 | 9/2002 |
| JP | 2002-270724 | 9/2002 |
| JP | 2002-270725 | 9/2002 |
| JP | 2002-270726 | 9/2002 |
| JP | 2002-314245 | 10/2002 |
| JP | 2007-27157 | 2/2007 |
| JP | 2007-214162 | 8/2007 |
| JP | 2007-227737 | 9/2007 |
| JP | 2007-273602 | 10/2007 |
| JP | 2007-273603 | 10/2007 |
| JP | 2007-281396 | 10/2007 |
| JP | 2008-235469 | 10/2008 |
| JP | 2010-135718 | 6/2010 |
| JP | 2010-186022 | 8/2010 |
| JP | 2011-222830 | 11/2011 |
| JP | 2015-111620 | 6/2015 |
| WO | WO 2011/129313 | 10/2011 |

OTHER PUBLICATIONS

Ho et al., "Mid-infrared reflectance of silicone resin coating on metal substrates: Effect of polymeric binders' absorption", Infrared Physics & Technology 38 (1997) pp. 123-131, See Cite No. 68.

Extended European Search Report for corresponding EP Application No. 17164131.9-1551, dated Aug. 1, 2017.

Restriction and Election of Species requirement issued by the U.S. Patent and Trademark Office for the parent U.S. Appl. No. 15/475,164, dated Sep. 8, 2017.

Office Action issued by the U.S. Patent and Trademark Office for the parent U.S. Appl. No. 15/475,164, dated Jul. 23, 2018.

Office Action with Form PTO-892 Notice of References Cited issued by the U.S. Patent and Trademark Office for the parent U.S. Appl. No. 15/475,164, dated Jan. 15, 2019.

Advisory Action with Form PTO-892 Notice of References Cited issued by the U.S. Patent and Trademark Office for the parent U.S. Appl. No. 15/475,164, dated Apr. 25, 2019.

Office Action with Form PTO-892 Notice of References Cited issued by the U.S. Patent and Trademark Office for the parent U.S. Appl. No. 15/475,164, dated Sep. 12, 2019.

Notice of Allowance issued by the United States Patent and Trademark Office for the parent U.S. Appl. No. 15/475,164, dated Dec. 30, 2019.

* cited by examiner

METHOD OF MANUFACTURING LIGHT EMITTING ELEMENT MOUNTING BASE MEMBER, METHOD OF MANUFACTURING LIGHT EMITTING DEVICE USING THE LIGHT EMITTING ELEMENT MOUNTING BASE MEMBER, LIGHT EMITTING ELEMENT MOUNTING BASE MEMBER, AND LIGHT EMITTING DEVICE USING THE LIGHT EMITTING ELEMENT MOUNTING BASE MEMBER

CROSS-REFERENCE TO RELATED APPLICATION

This application claims priority to Japanese Patent Application No. 2016-074,776, filed on Apr. 1, 2016 and Japanese Patent Application No. 2017-061,242, filed on Mar. 27, 2017, and is a divisional application of U.S. application Ser. No. 15/475,164, filed on Mar. 31, 2017, the contents of which are hereby incorporated by reference in their entirety.

BACKGROUND

1. Field of the Invention

The present disclosure relates to a method of manufacturing a light emitting element mounting base member, a method of manufacturing a light emitting device using the light emitting element mounting base member, a light emitting element mounting base member, and a light emitting device using the light emitting element mounting base member.

2. Discussion of the Background

As light sources of various kinds, a light emitting device that incorporates a light emitting element such as a light emitting diode (LED) chip is used. One of these light emitting devices includes a light emitting element, and a base member on which the light emitting element is mounted. For example, Japanese Unexamined Patent Publication No. 2008-235469 and Japanese Unexamined Patent Publication No. 2010-135718 describe light emitting devices having light emitting elements mounted in an assembly of light emitting device housings in which a lead frame obtained by processing a metal sheet by punching, etching or other methods is integrated with a resin using an insert molding technique.

An operation of forming the lead frames in manufacturing an assembly of light emitting device housings necessitates punching or etching, which generates a large amount of wastes and waste liquid, thereby leading an increase in costs of the lead frames, and consequently in costs of the ultimately manufactured light emitting device.

The present embodiments have been made in view of the above-mentioned circumstances, and an object thereof is to provide a method of manufacturing a light emitting element mounting base member with a reduced cost, a method of manufacturing a light emitting device using the light emitting element mounting base member, a light emitting element mounting base member, and a light emitting device using the light emitting element mounting base member.

SUMMARY

A method of manufacturing a light emitting element mounting base member according to one aspect of the present disclosure includes: providing a first insulating member in a plate shape having at least one recess portion or at least one through-hole; disposing in the recess portion or in the through-hole a light blocking resin and a plurality of core members each equipped with a second insulating member having light reflectivity provided on each surface of a plurality of electrical conductor cores; and exposing at least one of the surface of the electrical conductor cores from the second insulating members by removing each part of at least one of the second insulating members.

The light emitting element mounting base member according to one aspect of the present disclosure is a light emitting element mounting base member including: a plurality of electrical conductor cores; a second insulating member having light reflectivity that covers at least one lateral surface of each of the electrical conductor cores; a light blocking resin that joins the at least two second insulating members; and a first insulating member that is in contact with the light at least one blocking resin, wherein at least one upper surface of the electrical conductor cores and at least one lower surface of the electrical conductor cores are exposed from the light blocking resin.

Accordingly, there can be provided a method of manufacturing a light emitting element mounting base member with reduced cost, a method of manufacturing a light emitting device using the light emitting element mounting base member, a light emitting element mounting base member, and a light emitting device using the light emitting element mounting base member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
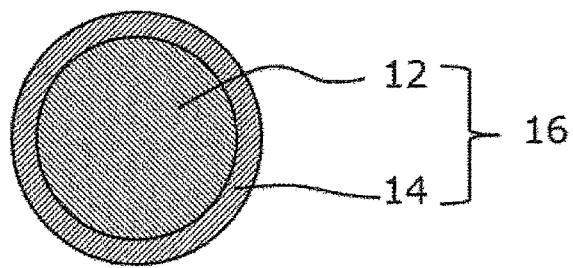
FIG. 1 is a schematic cross-sectional view showing a core member.

Hereinafter, embodiments of the present disclosure will be described with reference to the drawings as necessary. It is to be noted that a light emitting element mounting base member and a method of manufacturing a light emitting element mounting base member as described below is intended to implement the technical concept of the present disclosure, and the present disclosure is not limited to the following unless otherwise specified. Further, the description provided in one embodiment or example is applicable to other embodiment or example. In the description of the structure of other embodiment, identical or similar members are denoted by identical names, and their detailed descriptions are omitted as appropriate. The sizes, positional relations and so on of members shown in the drawings may be exaggerated for clarification of explanations.

A method of manufacturing a light emitting element mounting base member 100 according to one embodiment of the present disclosure includes: providing a plate-shaped first insulating member having a recess portion or a through-hole; disposing in the recess portion or in the through-hole a light blocking resin and a plurality of core members having a light-reflecting insulating member on a surface of an electrical conductor core; and exposing the surface of the electrical conductor core from a second insulating member by removing a part of the second insulating member. Hereinafter, a description will be given of the method of manufacturing the light emitting element mounting base member according to the present embodiment with reference to FIGS. 1 to 14.

Providing First Insulating Member

Figure 2:
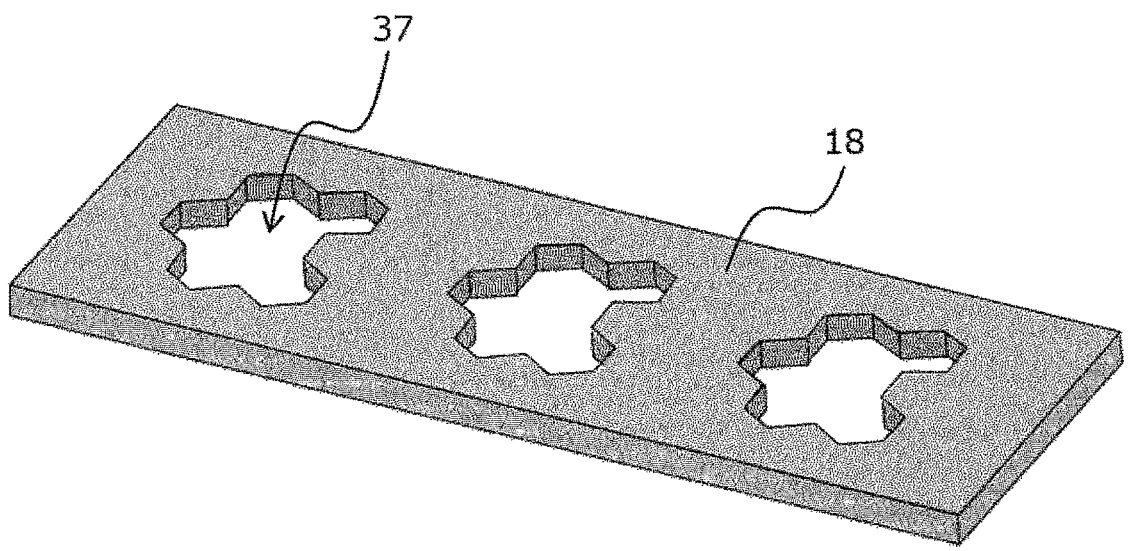
FIG. 2 is a schematic view illustrating a manufacturing method according to one embodiment of the present disclosure.

In the present embodiment, an insulating sheet having through-holes 37 as shown in FIG. 2 is provided as a first insulating member 18. As the insulating sheet, for example, a resin sheet can be used. The through-hole 37 is a hole for disposing a core member 16. The shape of the through-hole 37 in top view and the shape of the through-hole 37 in the depth direction can be appropriately designed depending on the number of the core members 16 and the size of the core member 16, and the through-hole 37 is formed at an area where the core member 16 is disposed.

The insulating sheet serving as the first insulating member 18 may be formed of a single material, or formed of a plurality of materials such as a plurality of resin sheets bonded together or a metal thin plate with at least one insulating film, which has a predetermined thickness, provided on the upper and lower surfaces thereof. The thickness of the first insulating member 18 may be a thickness which at least ensures that the core member 16 can be held.

Preferably, the thickness of the first insulating member 18 is not smaller than ½ of the height of the core member 16 and not larger than the height of the core.

For disposing the core members, the first insulating member 18 may be provided with recess portions rather than through-holes. The bottom of the recess portion may be flat, or for controlling disposition of the core member, a through-hole or a projection portion, or a combination of a through-hole and a projection portion may be provided at a predetermined position. For an insulating sheet having recess portions, a 1 mm-thick resin sheet provided with through-holes 37, and 0.1 mm-thick resin sheets bonded together can be used, for example. The shape of the recess portion in top view and the shape of the recess portion in the depth direction can be appropriately designed depending on the number of core members 16 and the size of the core member 16, and the recess portion is formed at a position where the core member 16 is disposed.

Disposing Light Blocking Resin and Core Member

Next, a plurality of core members 16 and a light blocking resin 20 are disposed in through-holes 37 of the first insulating member 18. As shown in FIG. 1, the core member 16 has a light-reflecting second insulating member 14 on the entire surface of a spherical electrical conductor core 12. The electrical conductor core 12 may have a shape other than a sphere, and preferably has a shape that allows an insulating member to be easily formed on the surface. The size of the electrical conductor core 12 can be appropriately selected depending on the size of a light emitting element 24 to be mounted, and the size of a light emitting device 200 obtained in the present embodiment. For example, when the electrical conductor core 12 is spherical shape, it may have a diameter in a range of about 0.1 mm to about 2.0 mm.

The light-reflecting second insulating member 14 may be formed over the entire surface of the electrical conductor core 12 by, for example, repeating the following step a required number of times: spray-coating the entire surface of the electrical conductor core 12 with the light-reflecting second insulating member 14 and baking the light-reflecting second insulating member 14. The thickness of the light-reflecting second insulating member 14 may be, for example, about 0.01 to 0.1 mm.

Figure 3:
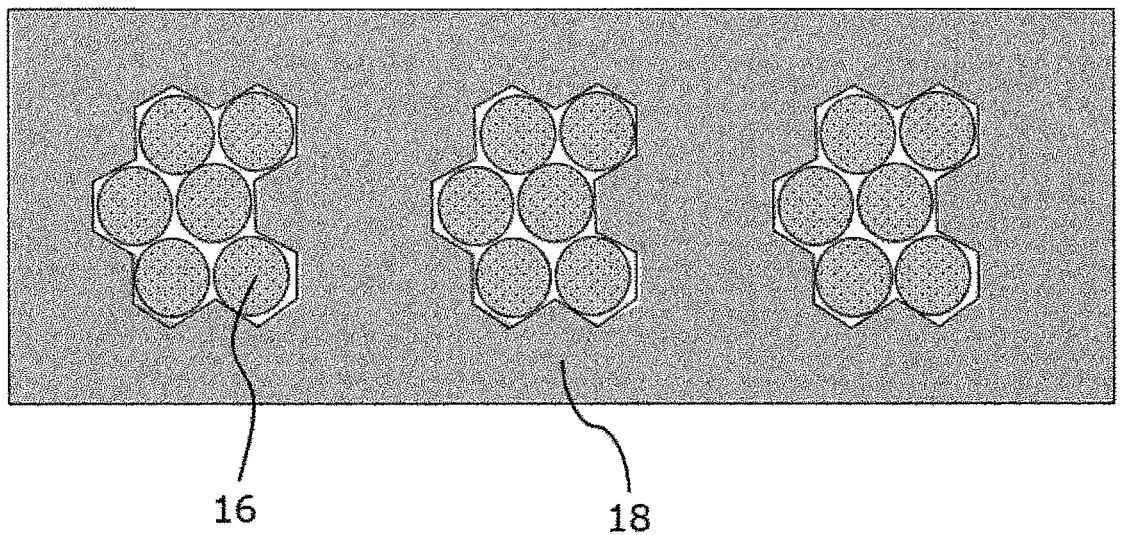
FIG. 3 is a schematic view illustrating the manufacturing method according to one embodiment of the present disclosure.

As shown in FIG. 3, a plurality of core members 16 in substantially spherical shapes are arranged in the through-hole 37 formed in the first insulating member 18. In the present embodiment, six core members 16 are arranged in one through-hole. To adjust the position of the core members 16, some of the plurality of core members 16 may be replaced by insulating spacer members which are each substantially the same size and shape as the core members.

Adjacent core members 16 arranged in the through-hole may be bonded to each other by an adhesive agent. The inner wall of the through-hole 37 of the first insulating member 18 may be bonded to the lateral surface of the core member 16. Because the light blocking resin 20 is disposed in a gap between the first insulating member 18 and the core member 16 and in a gap between adjacent core members, the bonding may only temporarily fix the core members, or the core members may be temporarily fixed by the inner wall of the through-hole 37.

The light blocking resin 20 may be disposed so in such a manner as to fill a gap between the first insulating member 18 and the core member 16 and a gap between adjacent core members after the core members 16 are arranged. Otherwise the core members 16 may be arranged after the light blocking resin 20 is disposed in the through-hole.

The core portions 16 can be less likely to fall off from the through-hole 37 in the following manner. The core members 16 are provided with each diameter greater than a thickness of the first insulating member 18. The core members 16 are disposed in the through-hole 37. Then, for example, portions of the core members are squashed by pressing or other technique at portions where the core members 16 protrude in the thickness direction from the upper surface and/or the lower surface of the first insulating member 18, to spread core members 16 in the surface direction of the first insulating member 18 so that the contact area between adjacent core members or between the core member and the first insulating member is increased. Accordingly, the core members 16 are less likely to fall off without using an adhesive agent.

Figure 4:
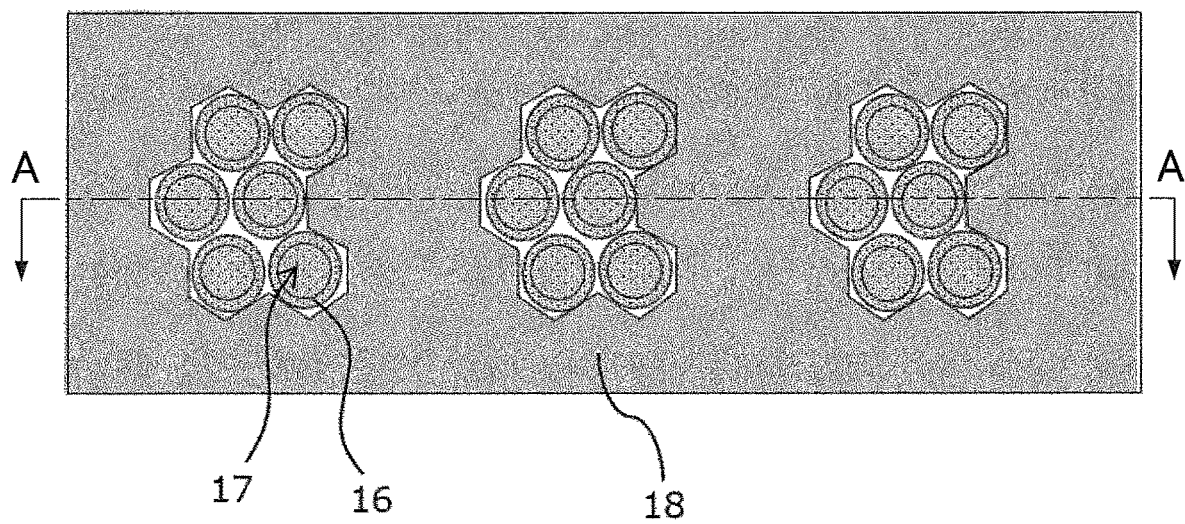
FIG. 4 is a schematic view illustrating the manufacturing method according to one embodiment of the present disclosure.
Figure 5:
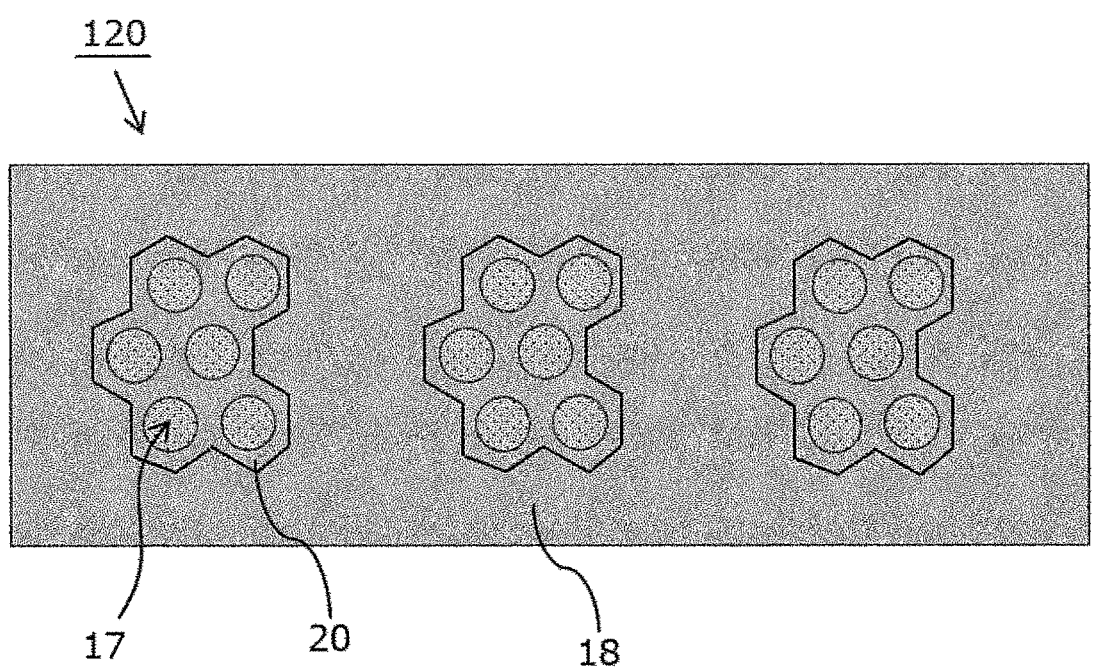
FIG. 5 is a schematic view illustrating the manufacturing method according to one embodiment of the present disclosure.
Figure 12:
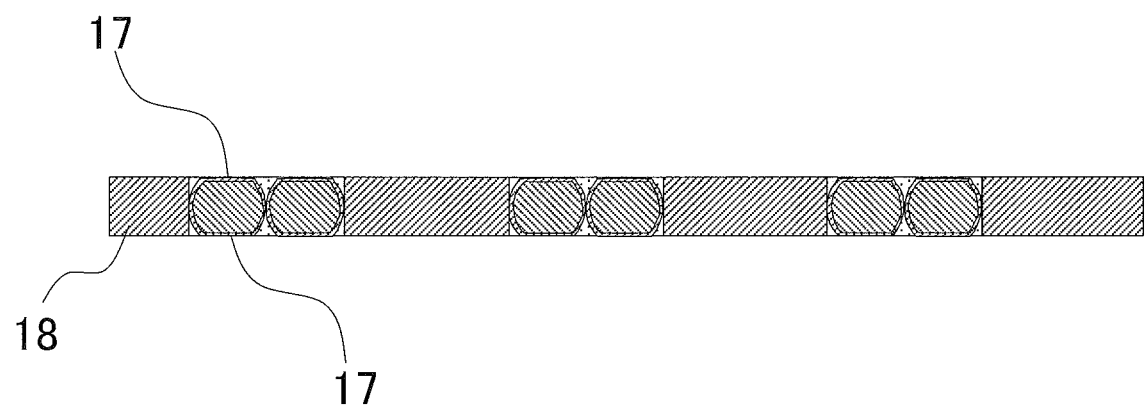
FIG. 12 is a schematic diagram illustrating a cross-sectional view taken along an A-A line of FIG. 4.

The first insulating member 18 is placed between molds in a state that the core members 16 are fitted into the through-hole 37 by, for example, an insert molding technique. The upper surface and the lower surface of the core member 16 are pressed to squash to a predetermined amount, so that a flat surface 17 is provided on each of upper and lower sides of the core member as shown in FIGS. 4 and 12. In this way, the core members 16 are squashed. The flat surfaces 17 can be formed so as to be substantially flush with the upper surface and the lower surface of the first insulating member 18. When the core members 16 are squashed, it is preferable to dispose the light blocking resin after the core members are squashed. For example, the flat surfaces 17 of the core members and the upper surface of the first insulating member 18 are pressed with a mold, and a light blocking resin composition is fed into gaps and cured to obtain a flat plate-shaped base member preparatory body 120 in which the flat surfaces 17 of the core members are exposed outside the upper and lower surfaces as shown in FIG. 5.

Exposing Electrical Conductor Core

Figure 6:
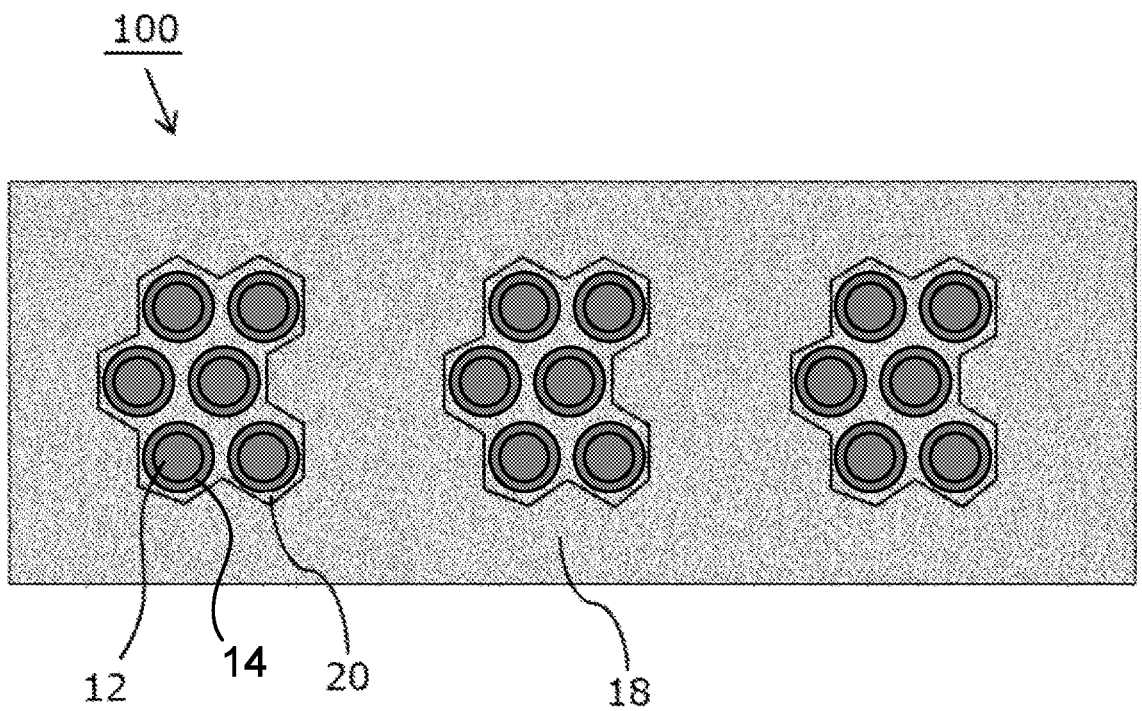
FIG. 6 is a schematic view illustrating the manufacturing method according to one embodiment of the present disclosure.
Figure 13:
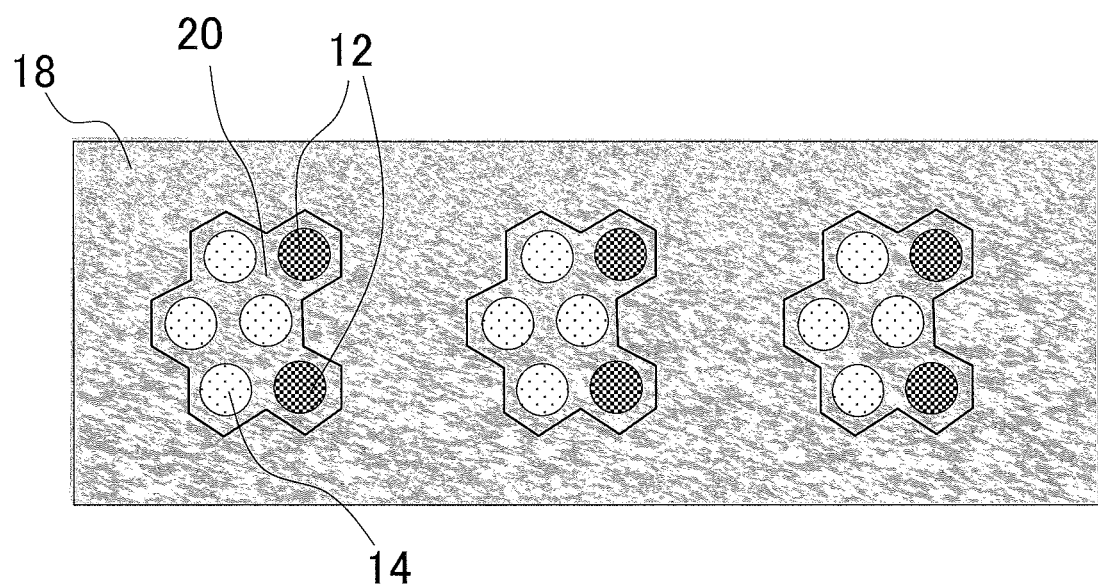
FIG. 13 is a schematic diagram illustrating a bottom view of one embodiment of the present disclosure shown in FIG. 6.
Figure 14A:
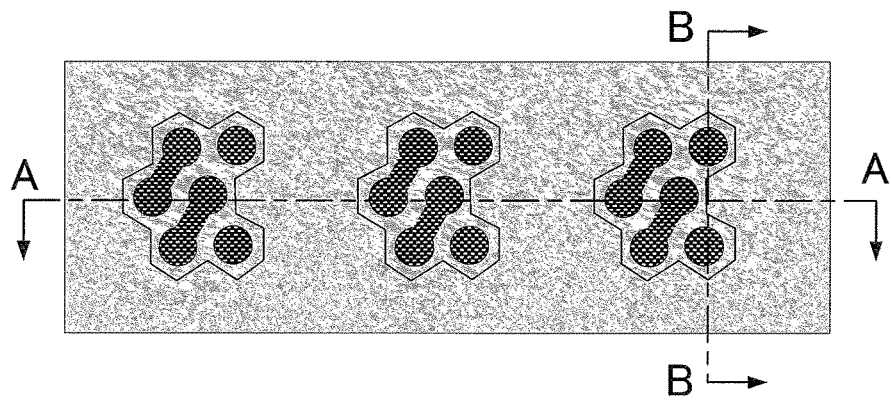
FIG. 14A is a schematic diagram illustrating a top view of one embodiment of the present disclosure shown in FIG. 7.
Figure 14C:
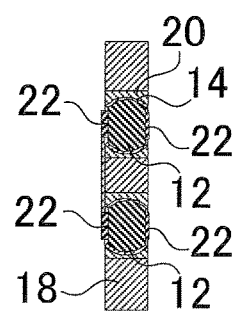
FIG. 14C is a cross-sectional view taken along a B-B line in FIG. 14A.
Figure 14B:
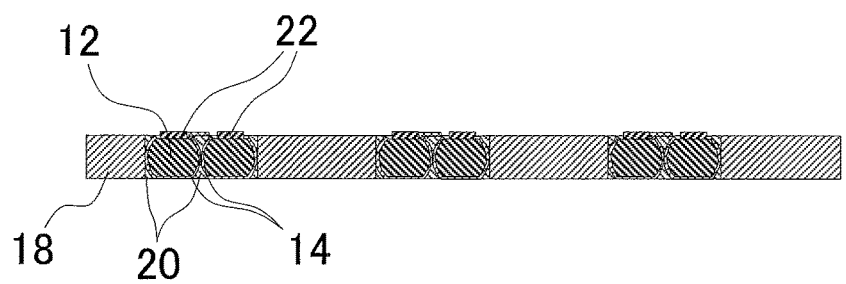
FIG. 14B is a cross-sectional view taken along an A-A line of FIG. 14A.
Figure 14D:
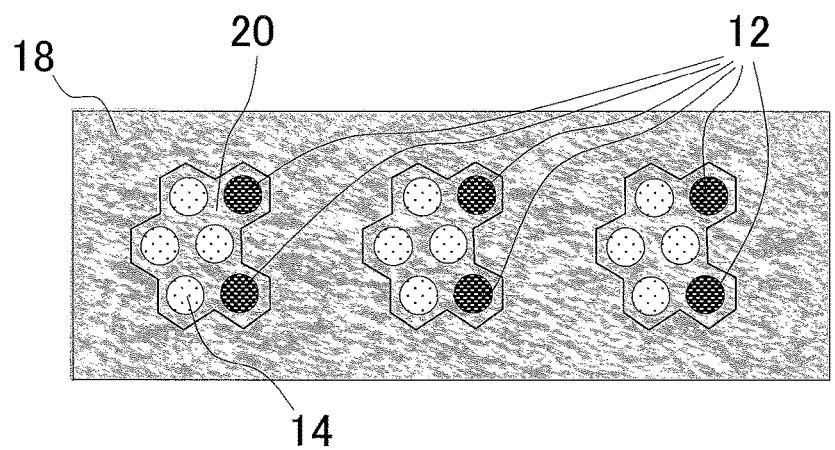
FIG. 14D is a bottom view of one embodiment of the present disclosure shown in FIG. 7.

Subsequently, the light-reflecting second insulating member 14 forming the flat surfaces 17 of the core members, which are exposed outside the upper and lower surfaces of the obtained base member preparatory body 120, is removed. Then the plurality of electrical conductor cores 12 are exposed outside the external surface of the base member preparatory body 120, as illustrated in FIGS. 6 and 13. The external surface refers an upper surface, in other words, the surface on which the light emitting element is mounted, and/or the lower surface.

The second insulating member 14 can be removed by any method including mechanical removal by machining or chemical removal by etching or other technique. The insulating member 14 forming the flat surfaces 17 can be dissolved and removed with a solvent to expose the electrical conductor cores 12 outside the upper and lower surfaces. Here, the second insulating member 14 in a region where the core members 16 are in contact with each other is not removed, and only the insulating member 14 forming the flat surfaces 17 and the insulating member 14 covering an area where the core members are not in contact with one another are removed. Accordingly, the light emitting element mounting base member 100 is obtained with a structure of anisotropic electrical conductor establishing conduction in a vertical direction but not in a lateral direction, in which the electrical conductor cores 12 are disposed in predetermined regions.

It is preferable that a member having high light-reflecting property is embedded in a region, from which the second insulating member 14 is removed, except for a region serving as a connection region with the light emitting element because the light reflectivity of a surface of the light emitting element mounting base member can be improved. The member having high light-reflecting property may be the above-mentioned light blocking resin 20, or other than the light blocking resin 20, an insulating member having high light-reflecting property may be disposed.

When the second insulating member 14 is dissolved and removed with a solvent, the second insulating member 14 and the light blocking resin 20 are preferably different materials or different resins. Accordingly, the light blocking resin 20 does not tend to be dissolved when the second insulating member 14 is dissolved and removed.

The electrical conductor cores 12 and the light blocking resin 20 are exposed outside an upper surface and a lower surface of the light emitting element mounting base member 100 formed as described above. In other words, the upper surface and the lower surface of the light emitting element mounting base member 100 are formed by the electrical conductor cores 12, the light blocking resin 20 and the first insulating member 18. In the present embodiment, the light blocking resin 20 is surrounded by the first insulating member 18.

Forming Metal Film

Figure 7:
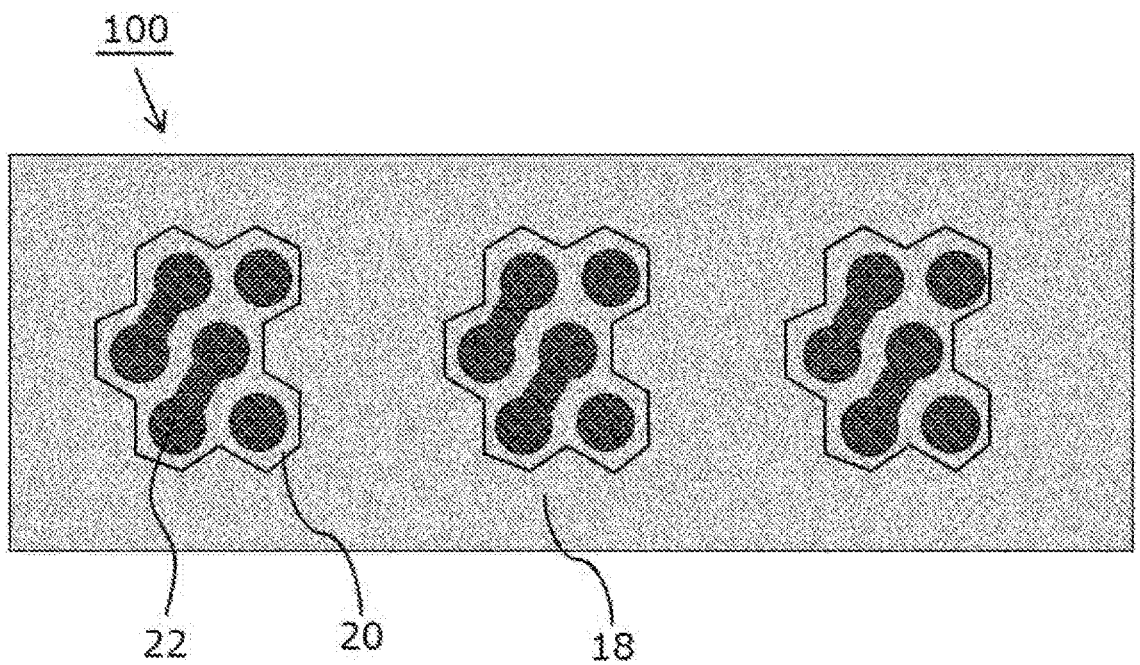
FIG. 7 is a schematic view illustrating the manufacturing method according to one embodiment of the present disclosure.

Metal films 22 may be formed and disposed at the exposed portions of the electrical conductor cores 12 of the light emitting element mounting base member 100 by plating or sputtering. For example, one of the metal film 22 may be formed by sputtering with a metal mask or a photoresist mask in a predetermined region of the upper surface. Thereafter, one of the metal film 22 may be formed by sputtering with a metal mask or a photoresist mask in a predetermined region of the lower surface. In the present embodiment, each of the metal film 22 is formed on the exposed surfaces of the electrical conductor cores 12, and the surface of the light blocking resin 20 to connect the exposed surfaces of a plurality of electrical conductor cores 12 as shown in FIGS. 7 and 14. Specifically, one metal film 22 is disposed so as to connect a pair of core members including two core members 16 linearly arranged among the plurality of core members 16. Because the metal films 22 are connected to the light emitting elements 24 or to the outside of the light emitting device via a connection terminal (e.g., connector) or the like, the metal films 22 are preferably made of a material that is highly electrically conductive and/or capable of establishing good mechanical and electrical connection. A material having high light-reflecting property, for example, silver is used for the metal film 22 on the upper surface side, in other words, a surface on which the light emitting elements 24 are to be mounted. The metal film may not be formed on all the exposed surfaces of the electrical conductor cores, and need only be formed on necessary areas.

Mounting Light Emitting Element

Figure 8:
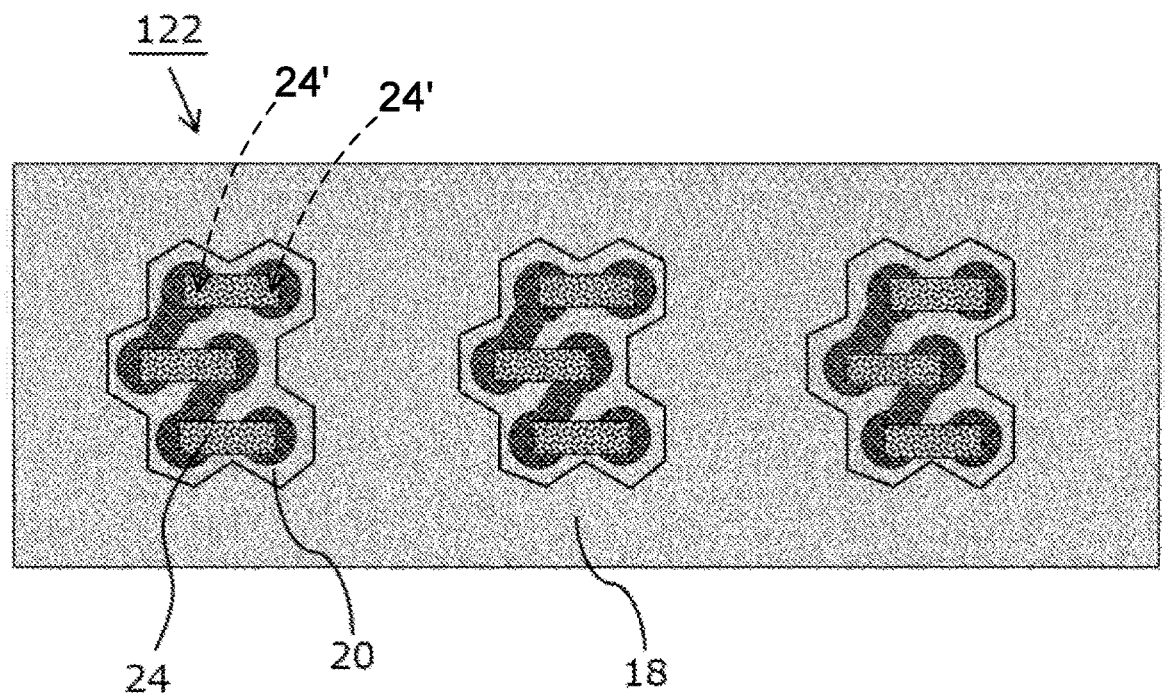
FIG. 8 is a schematic view illustrating the manufacturing method according to one embodiment of the present disclosure.

As shown in FIG. 8, a plurality of light emitting elements are mounted on the upper surface of a metal film-equipped light emitting element mounting base member obtained as described above. In the present embodiment, the light emitting elements 24 each including a pair of positive and negative electrodes 24' on one surface thereof are flip-chip-mounted on the upper surface of the light emitting element mounting base member 100 while the surfaces of the light emitting elements 24 including the electrodes are situated on the light emitting element mounting base member 100 side. At this time, one metal film 22 and the positive or negative electrode of one of the light emitting element 24 are electrically connected to each other. The electrical connection between the light emitting element mounting base member 100 and the light emitting elements 24 may be performed using solder, anisotropic conductive paste or the like. Accordingly, a light emitting device assembly 122 is obtained.

To obtain the light emitting device 200 including the plurality of light emitting elements 24, the metal films 22 are disposed in a such manner as to connect the light emitting elements in a desired electrical connection such as parallel connection or series connection. In FIG. 8, the metal film 22 is disposed in such a manner that three light emitting elements 24 are connected in series, and the light emitting elements 24 are respectively mounted on the metal films 22. The electrical conductor cores 12 or the metal films 22 that are in conduction with the electrical conductor cores 12 are exposed at a predetermined region of the lower surface of the light emitting element mounting base member provided with metal films to serve as external electrode terminals of the singulated light emitting devices 200.

Figure 10:
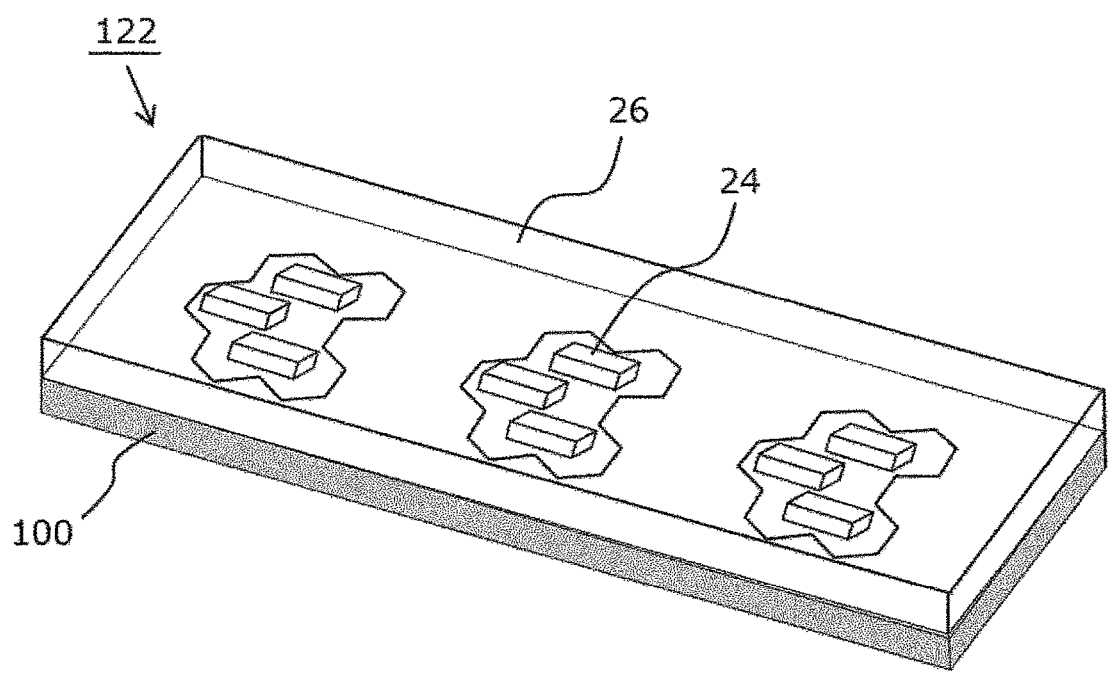
FIG. 10 is a schematic view illustrating the manufacturing method according to one embodiment of the present disclosure.

The light emitting device assembly 122 may include an encapsulating member covering the light emitting elements 24. For example, the light emitting element 24, and the upper surface of the light emitting element mounting base member 100 (i.e., the surface on which the light emitting element are mounted) are covered and encapsulated with the encapsulating member 26 as shown in FIG. 10.

In the present embodiment, an enlarged area of the light emitting element mounting base member can increase the number of light emitting elements that are collectively undergone processes such as mounting and encapsulating the light emitting elements. Accordingly, manufacturing costs can be reduced.

Singulating

Figure 11:
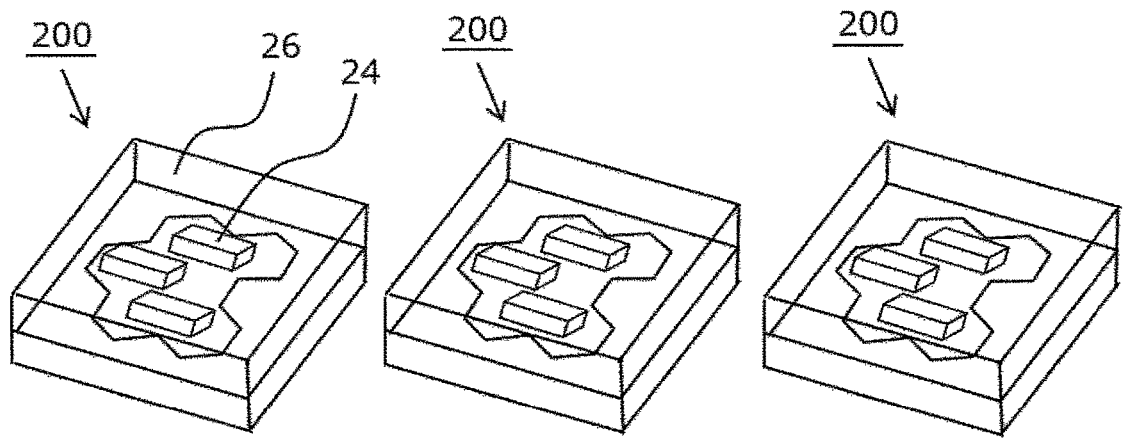
FIG. 11 is a schematic view illustrating a light emitting device according to one embodiment of the present disclosure.

The light emitting device assembly 122 is cut and/or divided along predetermined cutting/dividing lines and thus singulated, so that each resultant piece includes at least two core members. Thus, the light emitting devices 200 shown in FIG. 11 are obtained. For example, it is preferable that the cutting/dividing lines are provided at a position where only the first insulating member 18 or the first insulating member 18 and the encapsulating member 26 are cut. When a proportion of a metal member is high with respect to other members on the cutting/dividing lines for dividing and singulating the light emitting device assembly 122, costs of singulation is increased. For example, in the case where the light emitting device assembly 122 is punched with a mold or cut with a dicing blade, the cutting tool wears out faster with metals than with resin. When for example glass epoxy is used as a material of the first insulating member, braking can be performed, but existence of a metal member in the cutting/dividing region makes it difficult to perform braking. In the present embodiment, the electrical conductor cores 12 previously separated are integrally held to use as the light emitting element mounting base member 100, so that singulation can be performed without cutting the metal material. Accordingly, cutting can be performed at a high speed, and wear of the cutting blade is reduced, so that productivity can be improved.

By using the previously separated spherical electrical conductor cores 12, the resulting light emitting element mounting base member 100 can be easily produced with a great area.

Further, the light emitting device 100 preferably has a structure that the electrical conductor cores 12 immediately below the light emitting elements 24 are each covered with the light-reflecting insulating members 14 with the metal films 22 being formed thereon, because the heat dissipation path (i.e., the electrical conductor cores 12 positioned directly below the light emitting elements 24) and the current flow path (i.e., the electrical conductor cores 12 electrically connected to the metal films 22 outside the light emitting elements 24) are easily designed to be separated from each other.

Modification

A frame body forming step for forming a recess portion for disposing the encapsulating member 26 may be provided as an optional step before the light emitting element encapsulating step after disposing the core members 16 and the light blocking resin 20.

Figure 9:
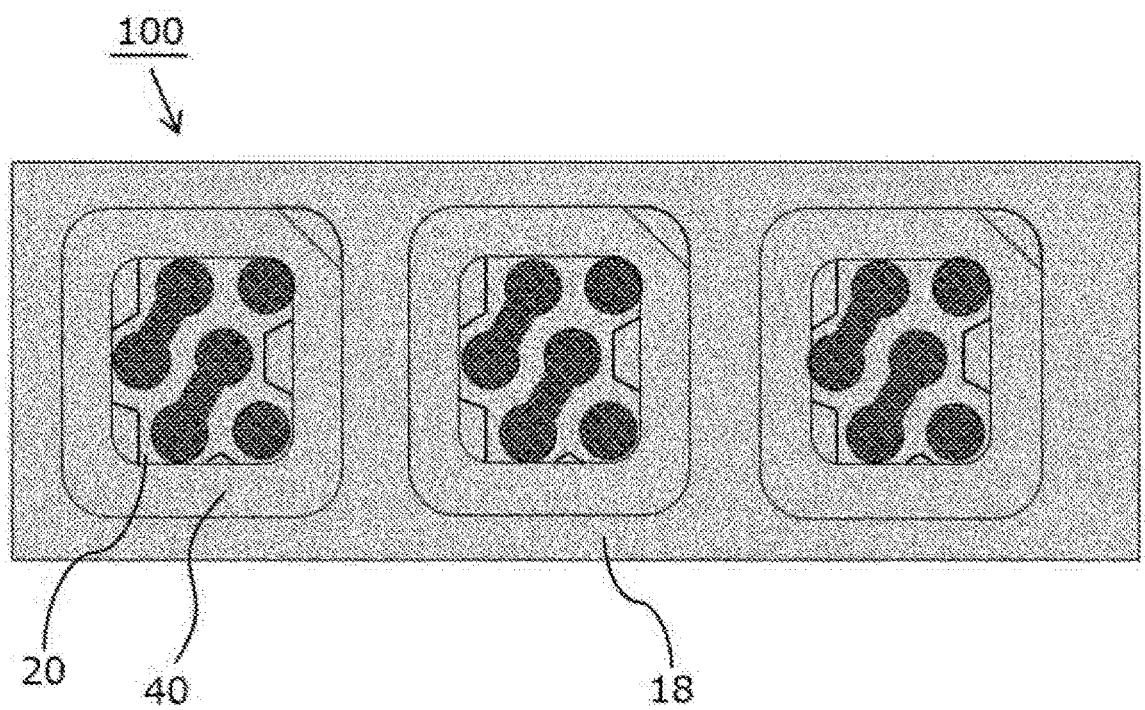
FIG. 9 is a schematic view illustrating a manufacturing method according to a modification of one embodiment of the present disclosure.

For example, frame bodies 40 may be formed as shown in FIG. 9 after formation of the metal film 22. The frame body 40 is formed on the upper surface of the light emitting element mounting base member 100 as shown in FIG. 7 in such a manner that the core members 16 are disposed on the bottom surface of a recess portion formed by the frame body 40 and the upper surface of the light emitting element mounting base member 100. The frame bodies 40 may be formed separately from one another such that a frame body is not in contact with the adjacent frame body as illustrated in FIG. 9, or an upper surface of the recess portion may be connected to the upper surface of an adjacent recess portion. After forming the frame bodies 40, through exposing the electrical conductor core, forming the metal film and mounting the light emitting element mounting, disposing an encapsulating member in the frame bodies 40, and singulating is performed to obtain light emitting devices. It is preferable that in singulating, the first insulating member 18 between adjacent frame bodies 40 is cut such a manner as not to cut the frame bodies 40.

Hereinafter, a description will be given of materials and the like suitable for the constituent members of the light emitting device according to the embodiments.

Core Member

The core member at least includes the electrical conductor core and the light-reflecting insulating member. The core member is, for example, a metal core equipped with a light-reflecting insulating film, a metal sphere equipped with a light-reflecting insulating film or a graphite sphere equipped with a light-reflecting insulating film. The surface of the core member may have a fine irregular shape in order to enhance joining strength with the light blocking resin.

Electrical Conductor Core

The electrical conductor core is a member that is used as an electrode and/or a heat dissipation path of the light emitting device. For this purpose, the electrical conductor core may be made of an electrically conductive material such as metal. For example, the material of the electrical conductor core may be metal such as Cu, Al, Ag, Au, Pt, Pd, or Rh or alloy thereof, or a carbon material such as graphite. The electrical conductor core preferably reflects light emitted by the light emitting element mounted on the light emitting element mounting base member, for example, by 70%, and preferably by 80% or more. For example, in the case where the light emitting element emits blue or bluish light, the electrical conductor core is preferably made of Al, Ag or the like.

The electrical conductor core may be entirely in a single composition, or may have a plurality of regions differing in composition. For example, the electrical conductor core may have a multilayer structure in which two or more types of materials are included to form a first metal part covered with a second metal part by plating or the like. The electrical conductor core may contain an insulating material or member such as voids. The electrical conductor core may be made of an anisotropic conductive material, such as a stranded wire or a litz wire.

The shape of the electrical conductor core may be, for example, a cylindrical column, a prism (or a polyhedron), a sphere (including an ellipsoid), a round pipe (or a round tube), or any three-dimensional shape similar to the foregoing. The shape of the electrical conductor core is selected as appropriate depending on the structures provided in the light emitting element mounting base member, such as a through hole or a castellation.

The electrical conductor core is partially exposed outside the surface of the light emitting element mounting base member. At the exposed portion, the electrical conductor core is electrically connected to the light emitting element using a joining member such as a wire or solder. Accordingly, the electrical conductor core preferably has the size or the shape which allows the exposed portion to have the area and shape suitable for establishing connection with the light emitting element. For example, the electrical conductor core is exposed to be substantially flush with the upper surface and the lower surface of the light emitting element mounting base member. In the case where the metal film described later is provided in such a manner as to cover the exposed portion of the electrical conductor core, the metal film and the light emitting element are connected to each other via a joining member.

The light emitting element mounted on the light emitting element mounting base member may be in contact with any of the electrical conductor core, the light-reflecting insulating member, and the light blocking resin. The light emitting element being mounted on the electrical conductor core facilitates dissipation of heat generated by the light emitting element. The electrical conductor core and the electrode of the light emitting element can be directly connected to each other via an electrically conductive joining member such as solder without using wires, thereby achieving a reduction in size of the light emitting device.

One light emitting element mounting base member is provided with a plurality of core members in order for the electrical conductor cores to serve as the electrodes of the light emitting device. At least two electrical conductor cores should be provided to the base member of the light emitting device to serve as the electrodes of the light emitting device. Further, a plurality of electrical conductor cores may be used as one electrode of the light emitting device. For example, the electrode of the light emitting element may be joined with the electrical conductor cores disposed adjacent to each other via an electrically conductive joining member. The disposition of the electrically conductive portion in the light emitting element mounting base member can be changed as appropriate by changing the positioning of the core members each having the electrical conductor core. This improves flexibility in designing the light emitting element mounting base member.

The electrical conductor cores are exposed at the upper surface and the lower surface of the light emitting element mounting base member. A single electrical conductor core may be exposed at the two positions, namely, at the upper surface and the lower surface. Alternatively, some of the electrical conductor cores may be exposed at the upper surface and some others may be exposed at the lower surface. Use of the electrical conductor core joined to the light emitting element as the external terminal of the base member improves the heat dissipation property.

In the case where the electrical conductor core is used not as the electrode but as the heat dissipation path, the electrical conductor core and the light emitting element may not be electrically connected to each other, and the electrical conductor core is not necessarily exposed at the surface of the light emitting element mounting base member. The electrical conductor core(s) is/are preferably disposed continuously from around the light emitting element being the heat source to around the outer surfaces of the light emitting element mounting base member, so that heat from the light emitting element is easily released to the outside.

First Insulating Member

The first insulating member is preferably made of a material using a resin as a base material in view of costs and manufacturability. A resin such as a thermosetting resin or a thermoplastic resin can be employed as the resin for the base material. Specific examples of such a resin include an epoxy resin composition; a silicone resin composition; a modified epoxy resin composition such as a silicone modified epoxy resin; a modified silicone resin composition such as an epoxy modified silicone resin; polyimide resin compositions and modified polyimide resin compositions; polyphthalamides (PPA); polycarbonate resins; liquid crystal polymers (LCP); ABS resins; phenol resins; acrylic resins; PBT resins; polypropylene resins (PP); polyamides (PA 6 and PA66); polyphenylene sulfide resins (PPS); and polyether ether ketone resins (PEEK). The material of the base material can be selected from materials other than resin, for example, glass, glass epoxy or a ceramic green sheet.

In order to provide the base material with light reflectivity, a light-reflecting material in shape of, for example, particulate or fibrous. Specific examples of such materials include titanium dioxide, silicon dioxide, zirconium dioxide, potassium titanate, alumina, aluminum nitride, boron nitride, mullite, niobium oxide, or various kinds of rare-earth oxides (e.g., yttrium oxide, gadolinium oxide) may be added to such the base material or other member. For example, the light-reflecting insulating member is preferably set to exhibit the reflectivity on the average of 70% or more to the light emitted by the light emitting element in a range of 440 nm to 630 nm. Further, the light-reflecting insulating member preferably exhibits high average reflectivity than the employed electrical conductor core, in the range of 440 nm to 630 nm.

Light-Reflecting Second Insulating Member

In the present embodiment, the light-reflecting second insulating member covers the lateral surface of the electrical conductor core. The light-reflecting insulating member may have a single-layer structure, or a multilayer structure in which a plurality of layers are stacked. In the case of a plurality of layers, a thermosetting resin film can be provided on the side near the electrical conductor core and a joining layer on the outermost perimeter. This can achieve good productivity, because none or little adhesive agent is necessary, in forming the assembly of the core members.

The light-reflecting second insulating member is formed, for example on the lateral surface of the electrical conductor core, as a single layer film or a multilayer film in a substantially uniform thickness. The light-reflecting second insulating member has a thickness, for example, between several micrometers and several hundred micrometers. The light-reflecting second insulating member preferably has a thickness of about several ten micrometers, because both the electrical insulation and a reduction in size of the light emitting device (or the light emitting element mounting base member) can be achieved. The light-reflecting second insulating member may be formed in a substantially uniform thickness on the lateral surface of the electrical conductor core. Alternatively, the light-reflecting insulating member may be formed to be thicker at one area than at other area.

A portion of the electrical conductor core exposed outside the upper surface and the lower surface of the light emitting element mounting base member is also exposed from the light-reflecting second insulating member. The light-reflecting second insulating member is positioned around the electrical conductor core on the upper surface and the lower surface of the base member. The light-reflecting second insulating member being interposed between a plurality of electrical conductor cores allows the plurality of electrical conductor cores to be disposed as being insulated from each other.

The second insulating member is preferably made of a material using a resin as a base material in view of costs and manufacturability. A resin such as a thermosetting resin or a thermoplastic resin can be employed as the resin for the base material. Specific examples of such a resin include an epoxy resin composition; a silicone resin composition; a modified epoxy resin composition such as a silicone modified epoxy resin; a modified silicone resin composition such as an epoxy modified silicone resin; polyimide resin compositions and modified polyimide resin compositions; polyphthalamides (PPA); polycarbonate resins; liquid crystal polymers (LCP); ABS resins; phenol resins; acrylic resins; PBT resins; polypropylene resins (PP); polyamides (PA 6 and PA66); polyphenylene sulfide resins (PPS); and polyether ether ketone resins (PEEK). The material of the base material can be selected from materials other than resin, for example, glass.

In order to provide the base material with light reflectivity, a light-reflecting material in shape of, for example, particulate or fibrous such as titanium dioxide, silicon dioxide, zirconium dioxide, potassium titanate, alumina, aluminum nitride, boron nitride, mullite, niobium oxide, or rare-earth oxides (for example, yttrium oxide, gadolinium oxide) may be added to the base material. The light-reflecting insulating member preferably exhibits high reflectivity to light emission wavelength of the light emitting element mounted thereon. For example, the light-reflecting insulating member is preferably set to exhibit the reflectivity on the average of 70% or more to the light emitted by the light emitting element in a range of 440 nm to 630 nm. Further, the light-reflecting insulating member preferably exhibits high average reflectivity than the employed electrical conductor core, in the range of 440 nm to 630 nm.

The light-reflecting second insulating member may be formed in such a manner as to previously partially expose the electrical conductor cores. Alternatively, the entire surface of the electrical conductor cores may be covered with the light-reflecting second insulating member, and thereafter the light-reflecting second insulating member may be partially removed, so that the surface of the electrical conductor core is exposed from the second insulating member. In the case where the light-reflecting second insulating member is removed later, for example, thermosetting resin can be used for the base material of the light-reflecting second insulating member, and thermoplastic resin can be used for the light blocking resin. Therefore, the light-reflecting second insulating member can be selectively dissolved with a chemical agent using the difference in dissolving speed. In this manner, removal of the light-reflecting insulating member can be performed not only by cutting, but also by dissolving. Specific examples of the chemical agent include, for example, EPOTHROUGH, KSR, and DYNASOLVE.

Light Blocking Resin

The light blocking resin is an insulating member that integrally holds the plurality of core members.

Light blocking means herein that the resin is capable of blocking light from the light emitting element (e.g., mainly visible light) by, for example, 70%, preferably 90%, and further preferably 95% or more. The light-blocking effect may be attained by reflecting light or absorbing light. The light blocking resin can be white or black, for example. This makes the resin base material less likely to degrade due to light.

The light blocking resin may be thermosetting resin, thermoplastic resin or the like. In order to provide such resin with the light blocking property against light emitted by the light emitting element mounted thereon, a light-reflecting material, a light absorbing material or other materials can be added. Such an additive may be particulate, fibrous or other shape. The light blocking resin may be formed by a single material or a plurality of different materials. Further, the light blocking resin may present not only the space between a plurality of core members, but may also project on an upper side or a lower side.

Light emitted to the resin positioned vicinity of the light emitting element (in particular, at the position in contact with the light emitting element or the position facing the light emitting element) is extremely high in density. As the light emitting device drives, the light may cause degradation or discoloration of the resin, thereby reducing the light emission efficiency of the light emitting device. Providing light blocking property to the resin positioned immediately below the light emitting element discourages the resin from deteriorating due to light, and maintains the light emission efficiency of the light emitting device.

A resin such as a thermosetting resin or a thermoplastic resin can be employed as the resin for a base material of the light-blocking resin. Specific examples of such a resin include an epoxy resin composition; a silicone resin composition; a modified epoxy resin composition such as a silicone modified epoxy resin; a modified silicone resin composition such as an epoxy modified silicone resin; polyimide resin compositions and modified polyimide resin compositions; polyphthalamides (PPA); a polycarbonate resin; liquid crystal polymers (LCP); ABS resins; phenol resins; acrylic resins; PBT resins; polypropylene resins (PP); polyamides (PA6, PA66); polyphenylene sulfide resins (PPS); and polyether ether ketone resins (PEEK).

A light-reflecting material is preferably added to such resin. To serve as the light-reflecting material, powder of a reflecting member that is less likely to absorb light from the light emitting element and is largely different in refractive index from the resin serving as the base material (e.g., $TiO_2$, $Al_2O_3$, $ZrO_2$, or $MgO$) may be dispersed. Thus, light can be efficiently reflected.

Frame Body

The frame body may include the material similar to that of the light blocking resin described above. Similarly to the light blocking resin, the material preferably contains a light-reflecting material. The frame body may include a dielectric multilayer film, or a multilayer film made up of an insulating film and a metal film.

Metal Film

On the surface of the electrical conductor core exposed at the upper surface and the lower surface of the light emitting element mounting base member, the metal film may be formed by plating or the like. The metal film on the upper surface of the light emitting element mounting base member, which is a side where the light emitting element is mounted, is preferably made of metal being highly reflective to light emitted by the light emitting element. The metal film on the lower surface of the light emitting element mounting base member serving as the external electrode of the light emitting device is preferably made of metal that is good in wettability to solder. In consideration of adhesion between the outermost metal film and the electrical conductor core, the metal film may include a metal film serving as a base layer. That is, the metal film may have a multilayer structure.

The metal film may be formed not only on the surface of the electrical conductor core, but also on the surfaces of the light-reflecting insulating member and/or the light blocking member. For example, on at least one electrical conductor core on which the light emitting element is mounted, the metal film is formed across the surface of the electrical conductor core exposed at the surface of the light emitting element mounting base member and the surface of the insulating member and that of the light blocking resin positioned outside the electrical conductor core. Provision of such a metal film allows heat from the light emitting element to spread in the lateral direction of the base part of the light emitting device.

The metal film may function as a wiring layer that electrically connects two or more electrical conductor cores to each other. For example, so as to connect between adjacent electrical conductor cores, respective surfaces of the electrical conductor cores and the insulating members and the light blocking resin positioned between the adjacent electrical conductor cores are covered with the metal film. Thus, a serial or parallel wiring can be formed, and flexibility in designing the base member of the light emitting device improves. For example, when a plurality of light emitting elements are connected in series with the increased drive voltage and the reduced drive current, the voltage drop or power loss is less likely to occur, thereby improving the energy efficiency as the light source improves.

The metal film may be provided after the formation of the light blocking resin. Alternatively, the metal film may be provided to the electrical conductor core before the formation of the light blocking resin.

Light Emitting Element

Examples of the light emitting element that can be mounted on the light emitting element mounting base member include a light emitting diode, a laser diode, a light emitting transistor and a light emitting thyristor.

The light emitting element is preferably mounted on the exposed surface of the electrical conductor core in view of heat dissipation. An insulating member having good thermal conductivity or a thin insulating film may be provided between the light emitting element and the electrical conductor core. For example, a light emitting element including an insulating substrate such as a sapphire substrate can be junction-up-mounted on the exposed surface of the electrical conductor core.

In the case where flip-chip-mounting (also referred to as junction-down-mount) is performed, at least a pair of electrodes of the light emitting element is preferably electrically connected to two or more electrical conductor cores. In the case where bending stress is applied to the base part of the light emitting device, the bending stress tends to be concentrated not on a metal portion but on the resin portion that easily deforms than the metal portion. Accordingly, in performing the flip-chip mounting, bending stress concentrating on the insulating part present near the light emitting element may break the light emitting element, disconnect or crack the conductive connecting member such as solder or bumps, thereby possibly leading non-lighting of the light emitting element. By arranging a plurality of electrical conductor cores near the light emitting element, the light emitting element mounting part of the base part of the light emitting device and the surrounding part are formed by a plurality of light-reflecting insulating members or the light blocking resin. Therefore such resin parts disperse the bending stress, and the bending stress is less likely to concentrate on the region around the light emitting element. As a result, the present embodiment can reduce light emitting device failures, such as non-lighting, due to external stress applied to the base part.

Further, as compared to a frame-insert type light emitting element mounting base member, the interval between the adjacent light emitting device housings is narrow. Accordingly, in an assembly of the light emitting device housings, the interval between the light emitting element mounting parts can be narrowed. Thus, the processing capacity of the chip mounter can be increased, to reduce the assembling costs.

Insulating Spacer Member

The light emitting element mounting base member according to the present embodiment may further include the insulating spacer member. By disposing the spacer member between the core member and the core member, the distance between the core members can be set. This enhances flexibility in designing the light emitting element mounting base member or the light emitting device.

The insulating spacer member may be made of the material similar to that of the light-reflecting insulating member. Using a resin material, grinding, cutting, (i.e., singulating) and the like can be easily performed. Further, the shape can be determined as appropriate depending on the design of the light emitting element mounting base member to be obtained. For example, the shape may be a cylindrical column, a prism (a polyhedron), a sphere (including an ellipsoid), a round pipe (a round tube), or any shape similar to the foregoing. Further, a joining layer may be provided to the outermost perimeter. In order to enhance the joining force to the light blocking resin, the insulating spacer member may have fine irregular surfaces.

Other than being spherical, the insulating spacer member may be linear in shape depending on the distance desired to be adjusted, such as square bar-like or round bar-like shape. Further, the insulating spacer member may be film-like, or sheet-like with a certain thickness.

Protection Device

The light emitting device may include the protection device that protects the light emitting element from breakdown due to overcurrent. The protection device may be, for example, a Zener diode or a capacitor. The protection device with an electrode on one side is preferable so that the protection device can be face-down mounted without the necessity of using wires.

Encapsulating Member

The light emitting device may include the encapsulating member for protecting the light emitting element from external physical and chemical degradation factors. The encapsulating member need only be formed to directly or indirectly cover the light emitting element, and may be made of silicone resin or epoxy resin as a suitable material, for example. In case of an UV-LED, optical glass may be employed.

Other Members

The light emitting device may contain a light scattering member and/or a wavelength conversion member that converts part of light emitted by the light emitting element to light of different wavelength. For example, the encapsulating member may contain a wavelength conversion substance such as a fluorescent material. A resin member such as the light blocking resin may contain filler made of any appropriate substance, to adjust the property such as thermal conductivity or thermal expansion coefficient.

Example 1

As shown in FIG. 1, a glossy silver is plated on the electrical conductor core 12 configured with a 0.9 mm diameter-sphere mainly containing Cu. The glossy silver is plated by disposing Ni, Au, and Ag in a thickness of 0.02 mm from the Cu side of the electrical conductor core 12. Subsequently, a light-reflecting insulating member 14 that is a silicone resin containing titanium oxide is formed in a thickness of 0.06 mm over the entire surface of the electrical conductor core 12. Accordingly, a core member 16 having a diameter of 1.06 mm is obtained.

Subsequently, a first insulating member 18 is provided with 0.6 mm-thick resin sheet through-holes having a predetermined shape. As shown in FIG. 3, the core members 16 are aligned at a predetermined position in the through-hole, and joined. Using an insert molding technique, a planar array metal assembly is interposed between molds, and pressed to squash the core member 16 in a predetermined amount, so that a flat surface 17 is provided on each of upper and lower sides as shown in FIG. 4. Using a light-reflecting thermoplastic resin as a light blocking resin 20, molding is performed to obtain a base member preparatory body 120 including a planar array electrical conductor core assembly as shown in FIG. 5. At this time, a gap between the core members forms a resin inflow path, which also serves as an anchor.

A thermosetting resin on the flat surfaces 17 which form a part of the upper and lower surfaces of the base member preparatory body 120 and which are obtained by squashing the core member 16 is dissolved with a solvent. The glossy silver plating of the electrical conductor core 12 as a squashed copper sphere is exposed outside the upper and lower surfaces to form a light emitting element mounting base member 100 serving as an anisotropic electrical conductor as illustrated in FIG. 6. Plating is further performed to form metal films 22 as shown in FIG. 7. A plurality of electrical conductor cores may be connected by plating to form a wiring pattern by the metal film 22. Here, the upper surface (i.e., light emitting element mounting surface side) is subjected to light-reflecting plating (e.g. Ag plating). In the light emitting element mounting base member 100 prepared in the manner described above, an electrically conductive film having light reflectivity is previously formed on the electrical conductor core 12 by glossy silver plating, or the like, and the insulating film is dissolved and removed with a solvent. Thus, a light emitting element mounting base member can be provided in which a light emitting element mounting surface has a good light reflectivity.

The present disclosure is applicable to various kinds of light sources, as a base member of a light emitting device that includes at least one light emitting element such as an LED chip.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting element mounting base member, the method comprising:
providing a first insulating member in a plate shape having a plurality of through-holes;
disposing in each of the plurality of through-holes a light blocking resin and a plurality of core members of a spherical shape, the plurality of core members including a plurality of second insulating members covering a plurality of electrical conductor cores, the plurality of second insulating members having a reflectivity of 70% or more to light having a wavelength in a range of 440 nm to 630 nm;
squashing upper portions and lower portions of the plurality of core members to form each of the plurality of electrical conductor cores into a shape having a partial sphere shape and at least one flat surface; and
exposing from the light blocking resin disposed in each of the plurality of through-holes at least one upper surface of the plurality of the squashed electrical conductor cores and at least one lower surface of the plurality of the squashed electrical conductor cores by removing part of at least one of the plurality of second insulating members,
wherein the light blocking resin disposed in each of the plurality of through-holes joins at least two of the plurality of second insulating members, the light blocking resin being capable of blocking 70% or more of the light having the wavelength in the range of 440 nm to 630 nm,
wherein the first insulating member is in contact with the light blocking resin disposed in each of the plurality of through-holes, and
wherein the plurality of electrical conductor cores contain Cu and have an electrically conductive film formed thereon, the electrically conductive film containing Ni, Au, and Ag.

2. The method of manufacturing a light emitting element mounting base member according to claim 1, further comprising
after the exposing, disposing at least one metal film on at least one of the upper surface and the lower surface of the plurality of the squashed electrical conductor cores that is exposed from the plurality of second insulating members.

3. The method of manufacturing a light emitting element mounting base member according to claim 1,
wherein the exposing of the at least one upper surface of the plurality of the squashed electrical conductor cores and the at least one lower surface of the plurality of the squashed electrical conductor cores includes covering a region, from which the part of at least one of the plurality of second insulating members is removed, using the light blocking resin.

4. The method of manufacturing a light emitting element mounting base member according to claim 1,
wherein the exposing of the at least one upper surface of the plurality of the squashed electrical conductor cores and the at least one lower surface of the plurality of the squashed electrical conductor cores includes removing the part of at least one of the plurality of second insulating members using a solvent.

5. The method of manufacturing a light emitting element mounting base member according to claim 1, further comprising
cutting the first insulating member.

6. A method of manufacturing a light emitting device, the method comprising:
manufacturing the light emitting element mounting base member using the method according to claim 1; and mounting at least one light emitting element on the light emitting element mounting base member.

\* \* \* \* \*